US011190146B2

(12) United States Patent
Srinidhi Embar et al.

(10) Patent No.: US 11,190,146 B2
(45) Date of Patent: Nov. 30, 2021

(54) DOHERTY POWER AMPLIFIER DEVICES HAVING INTERGRATED OUTPUT COMBINING NETWORKS

(71) Applicant: NXP USA, Inc., Austin, TX (US)

(72) Inventors: Ramanujam Srinidhi Embar, Gilbert, AZ (US); Ebrahim M. Al Seragi, Mesa, AZ (US); Anthony Lamy, Tournefeuille (FR); Ricardo Uscola, Tempe, AZ (US); Damon G. Holmes, Scottsdale, AZ (US)

(73) Assignee: NXP USA, Inc., Austin, TX (US)

( * ) Notice: Subject to any disclaimer, the term of this patent is extended or adjusted under 35 U.S.C. 154(b) by 31 days.

(21) Appl. No.: 16/737,228

(22) Filed: Jan. 8, 2020

(65) Prior Publication Data

US 2021/0152130 A1 May 20, 2021

(30) Foreign Application Priority Data

Nov. 19, 2019 (EP) .................................... 19306486

(51) Int. Cl.
*H03F 1/02* (2006.01)
*H03F 3/21* (2006.01)
*H03F 3/195* (2006.01)
*H03F 1/56* (2006.01)
*H03F 3/24* (2006.01)

(52) U.S. Cl.
CPC ........... *H03F 1/0288* (2013.01); *H03F 1/565* (2013.01); *H03F 3/195* (2013.01); *H03F 3/211* (2013.01); *H03F 3/245* (2013.01); *H03F 2200/451* (2013.01); *H03F 2203/21106* (2013.01); *H03F 2203/21139* (2013.01)

(58) Field of Classification Search
CPC ........ H03F 1/0288; H03F 1/565; H03F 3/195; H03F 3/211; H03F 3/245; H03F 2200/451; H03F 2203/21106; H03F 2203/21139
USPC ......................................................... 330/307
See application file for complete search history.

(56) References Cited

U.S. PATENT DOCUMENTS

| 9,621,115 | B1 | 4/2017 | Wu |
| 9,692,361 | B2 | 6/2017 | Blednov |
| 2014/0145791 | A1 | 5/2014 | Svechtarov |

OTHER PUBLICATIONS

Steve, Cripps, "Revisiting the Doherty PA", ARMMS, UK, Nov. 24/25, 2008 (Year: 2008).*

(Continued)

*Primary Examiner* — Hafizur Rahman

(57) ABSTRACT

Doherty power amplifier (PA) devices (e.g., packages and modules) including integrated output combining networks are disclosed. In embodiments, the Doherty PA device includes a first amplifier die having a first transistor with a first output terminal at which a first amplified signal is generated, a second amplifier die having a second transistor with a second output terminal at which a second amplified signal is generated, and an output combining network. The output combining network includes, in turn, a combining node integrally formed with the second amplifier die and electrically coupled to the second output terminal. At least one die-to-die bond wire electrically couples the first output terminal to the combining node. The at least one die-to-die bond wire has an electrical length, which is results in a 90 degree phase shift imparted to the first amplified signal between the first output terminal and the combining node.

20 Claims, 6 Drawing Sheets

(56) References Cited

OTHER PUBLICATIONS

Merriam-Webster dictionary meaning of "Prong". Internet version. (Year: 1828).*
Qureshi, J.H. et al; "A Wide-Band 20W LMOS Doherty Power Amplifier"; IEEE MTT-S International Microwave Symposium; 4 pages (May 2010).

* cited by examiner

DOHERTY POWER AMPLIFIER DEVICES HAVING INTERGRATED OUTPUT COMBINING NETWORKS

RELATED APPLICATION

This application claims the priority under 35 U.S.C. § 119 of European Patent application no. 19306486.2, filed on Nov. 19, 2019, the contents of which are incorporated by reference herein.

TECHNICAL FIELD

Embodiments of the present disclosure relate generally to microelectronics and, more particularly, to Doherty power amplifier devices (e.g., packages and modules) including integrated output combining networks.

ABBREVIATIONS

Abbreviations appearing relatively infrequently in this document are defined upon initial usage, while abbreviations appearing more frequently in this document are defined below:
FET—field effect transistor;
MN—matching network;
PA—power amplifier;
PCB—printed circuit board; and
RF—radio frequency.

BACKGROUND

Doherty PA circuits are increasingly employed in wireless communication systems due to the favorable performance parameters (e.g., high gain, linearity, stability, and power-added efficiency levels) achieved by such circuits. By common design, Doherty PA circuits are constructed around a carrier amplifier and at least one peaking amplifier, which are implemented on separate transistor-bearing semiconductor dies. The semiconductor dies may be contained in a discrete microelectronic package (herein, a "Doherty PA package"). Alternatively, the semiconductor dies may be included in another type of Doherty PA device, such as a Doherty PA module. Additional circuitry is further provided to perform other functions supporting Doherty PA circuitry operation. Principally, these other functions include: dividing incoming RF signals into carrier and peaking signals transmitted along different signal-carrying paths within the Doherty PA device; introducing a phase shift between carrier and peaking signals, while providing input-side impedance matching upstream of the amplifiers; compensating for the input-side phase shift downstream of the amplifiers, while further providing output-side impedance matching; and ultimately recombining the carrier and peaking signals to yield a consolidated, amplified RF output signal. The amplified RF output signal is then applied to an electrical load, such as an antenna included in a cellular base station or other wireless communication system for over-the-air radiation to receiver devices.

BRIEF DESCRIPTION OF THE DRAWINGS

At least one example of the present invention will hereinafter be described in conjunction with the following figures, wherein like numerals denote like elements, and.

Figure 1:
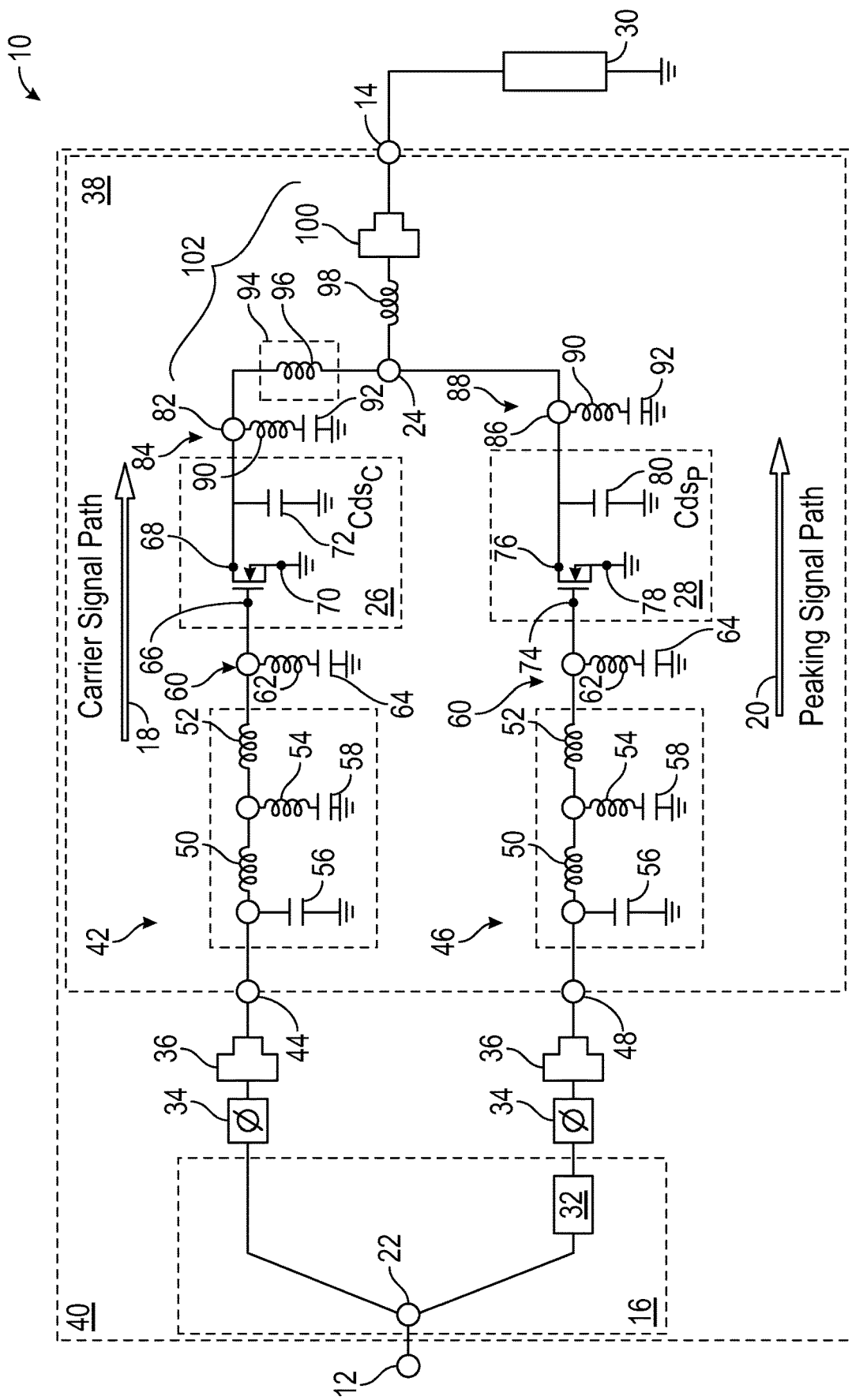
FIG. 1 is a generalized schematic of a Doherty PA circuit, which includes a Doherty PA device (e.g., a package or module) containing an integrated combining output network, as illustrated in accordance an example embodiment of the present disclosure.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

Overview

As described briefly above, Doherty PA systems combine various circuitry components with carrier and peaking amplifiers or "current generators" to boost the power of RF signals. The circuitry downstream of the carrier and peaking amplifiers (from a signal transmission standpoint) is referred herein as the "Doherty post-amplifier circuit section." The Doherty post amplifier-circuit section commonly includes a first output impedance MN, which is electrically coupled between the carrier amplifier and a combining node. The combining node may be provided on a substrate, such as a PCB, and serves as a point at which the amplified carrier and peaking signals are combined. In a similar manner, a second output impedance MN is electrically coupled between the peaking amplifier and the combining node. Additional MNs may also be provided between additional peaking amplifiers (s) and the combining node in the case of an N-way Doherty PA circuit (N>2). Such output impedance matching MNs may be referred to more specifically as "PCB output impedance MNs" when, for example, the output impedance MNs are implemented on a PCB, while the carrier and peaking amplifiers are contained in a Doherty PA package attached to the PCB. Such terminology is utilized to distinguish the PCB output impedance MNs from any pre-MNs contained within the Doherty PA package itself; e.g., between the carrier and peaking amplifiers and package output leads. Regardless of whether such output pre-MNs are present, the PCB output impedance MNs are typically predominately responsible for raising the impedance of the RF output signal to an appropriate value for driving an electrical load coupled to the output terminal of the Doherty PA circuit. In many instances, the load impedance may have a relatively high impedance value, such as an impedance approaching or exceeding 50 Ohms ($\Omega$). This presents a technical challenge in designing compact output impedance MNs capable of satisfying this relatively high impedance value, particularly when utilized in conjunction with high power transistors operated at relatively high frequencies; e.g., frequencies approaching or exceeding 3 Gigahertz (GHz). Further, conventional output impedance MNs often include a relatively large number of discrete circuit elements and, therefore, a correspondingly high number of element-to-element interfaces in the signal transmission path. In the aggregate, such element-to-element interfaces detract from circuit efficiency, while adding cost and complexity to circuit construction.

In addition to the above-described impedance transformation functionality, the Doherty post-amplifier circuit section of a given Doherty PA circuit traditionally performs a second important function, as well; i.e., the recombination of the carrier and peaking signals into a consolidated or unified RF output signal. When the Doherty PA circuit includes a Doherty PA package containing peaking and carrier amplifier dies, this function is conventionally performed downstream of the Doherty PA package by merging the amplified peaking and carrier signals at a package-external combining node, such as a combining node on the PCB to which the Doherty PA package is attached. To perform this recombination function, the Doherty post-amplifier circuit section includes at least one phase delay element, which introduces a controlled phase delay to either the carrier or peaking amplifier signal. This compensates for the phase delay previously applied to the other of the carrier and amplifier signal, ensuring that the carrier signal and the peaking signal(s) arrive in phase at the combining node to combine coherently. The phase delay element may be, for example, an impedance inversion element having an electrical length providing a phase shift of (n)$\lambda$/4 (or (n)90 degrees), with n being a positive odd integer. As an improvement over conventional approaches introducing signal delays exceeding 90 degrees, so-called "90/0" impedance inversion architectures have been recently implemented in which the output capacitance of the appropriate amplifier is absorbed into a $\lambda$/4 (quarter wave) transformer network. While representing an improvement over other types of impedance inversion architectures, such existing 90/0 impedance inversion architectures remain limited in certain respects. For example, existing 90/0 impedance inversion architectures often employ phase delay elements in the form of planar transmission lines providing a total electrical length of 90 degrees between the amplifier output and the combining node. Such planar transmission lines can be relatively lossy (due to parasitics) and detract from PA circuit performance. Planar transmission lines may also be relatively lengthy, thus exacerbating spatial constraints on a given PCB.

For at least the reasons above, industry demands continue to seek improvements in reducing transmission line losses and reducing Doherty PA circuit sizes, particularly as current and next generation (e.g., 5G) networks are deployed supporting mobile device communication in higher RF bands falling between, for example, 3.3 GHz and 6 GHz. In satisfaction of such industry demands, the following discloses Doherty PA assemblies (e.g., packages and modules) containing post-amplifier circuitry integrated into the Doherty PA device, while providing phase coherency, impedance transformation, and signal recombination of amplified carrier and peaking signals. In various embodiments in which the carrier and peaking amplifiers are implemented in a discrete microelectronic package (again, referred to herein as a "Doherty PA package"), such post-amplifier circuitry may be wholly contained within the Doherty PA package itself, while reducing, if not eliminating impedance transformation requirements downstream of the Doherty PA package. This, in turn, may enable a significant size reduction of the larger Doherty PA circuit or system into which the Doherty PA package is incorporated; e.g., an overall size reduction in the footprint of the Doherty PA circuit may approach, if not exceed 40% in at least some instances. As a further advantage, embodiments of the below-described Doherty PA assemblies are compatible with die technologies enabling reductions in die size (e.g., through the usage of shrunk gallium-nitride (GaN) die technologies) and with so-called "90/0" phase shift architectures of the type mentioned above. These and other benefits, such as greater bandwidth (BW) capabilities and the streamlined integration of harmonic termination circuits, are further achieved by embodiments of the Doherty PA assemblies disclosed herein.

Embodiments of the below-described Doherty PA assemblies achieve such benefits, in part, through the provision of one or more die-to-die bond wires joined between carrier and peaking amplifier dies within the Doherty PA device. A combining node is provided on one of the dies (e.g., the peaking amplifier die), with the die-to-die bond wires configured to apply the appropriate phase delay providing phase coherency as the carrier and peaking signals are consolidated at the combining node. For example, in embodiments in which the combining node is provided on the peaking amplifier die, one or more bond wires may couple an output terminal of the carrier amplifier die (e.g., a drain manifold or pad in the case of FET serving as the final stage of or the only stage of a carrier amplifier) to the combining node located on (integrally formed with) the peaking amplifier die. The combining node is electrically coupled to (and may be integrally formed with) the output terminal of the peaking amplifier die; e.g., as just noted, a drain manifold or pad in the case of FET serving as the final stage or only stage peaking amplifier. Such a unique topology provides a highly efficient, low loss (high-Q) signal conduction path between the transistors or "current generators" provided on the peaking and carrier amplifier dies and the combining node itself. Further, as previously stated, the bond wires in the die-to-die bond wire(s) are imparted with an appropriate electrical length to apply the desired output-side phase delay compensating for the previously-introduced input-side phase delay, such as an electrical length of about 90 degrees. In embodiments, the output capacitance (e.g., the drain-source capacitance or "parasitic" capacitance) of the carrier amplifier may be absorbed into the (e.g., quarter wave) transformer network to provide a highly efficient design. Such a design also facilitates highly efficient harmonic (e.g., 2fo terminations) where fo is the fundamental frequency of operation of the amplifier) termination designs, as described in more detail below.

Additional benefits are achieved through a unique spacing and orientation of the carrier and peaking amplifier dies within the Doherty PA device. Specifically, and continuing the example above in which the combining node is located on the peaking amplifier die, the amplifier dies may be oriented to minimize the distance between the combining node and the output terminal (e.g., drain manifold) of the carrier amplifier die. Bond wire length of the die-to-die bond wires may be minimized as a result Concurrently, the spacing or gap between the peaking and carrier amplifier dies may accommodate an input end portion of a transmission line formed on a substrate, with the input end portion located between the amplifier dies as seen looking downwardly on the substrate along an axis orthogonal to substrate's frontside or upper surface. The substrate may be, for example, a PCB embedded in a package body when the Doherty PA device assumes the form of a Doherty PA package. Alternatively, the substrate may be a module substrate to which the peaking and carrier amplifier dies are attached in embodiments in which the Doherty PA device assumes the form of a Doherty PA module. In embodiments, the input end portion of the transmission line is electrically connected to the combining node through one or more die-to-substrate bond wires. The transmission line provides a desired impedance transformation of the consolidated RF output signal, while conducting the signal to an output terminal of the Doherty PA circuit. In embodiments, the transmission line may raise the impedance of the RF output signal to a level matching the reference plane of the electrical load (e.g., 40 to 60Ω in the case of certain antennae) to minimize or eliminate, the need for additional impedance matching downstream of the Doherty PA device. This, in turn, may enable a large reduction in the overall size of the Doherty PA circuit; e.g., as mentioned above, the planform dimensions of a Doherty PA circuit may be reduced by 40% or more (e.g., enabling a reduction in overall PCB size) in implementations in which the Doherty PA device assumes the form of a Doherty PA package and additional impedance transformation downstream of the package is eliminated.

Turning now to the accompanying drawing figures, a general description of a Doherty PA circuit embodying various aspects of the present teachings is set-forth in connection with FIG. 1. Following this, an example implementation of the central or central circuit structure of the Doherty PA circuit, which includes an integrated output combining network containing a combining node integrated within a peaking amplifier die, is further discussed in connection with FIGS. 2 and 3. Finally, examples of Doherty PA assemblies into which the example central circuit structure shown in FIGS. 2 and 3 may be incorporated are further described below in conjunction with FIGS. 4-6. While the following description principally focuses on Doherty PA assemblies having certain features, the teachings embodied in the following description are not so limited; rather, the following teachings are broadly applicable to various types of Doherty PA assemblies containing integrated output combining networks of the type described herein. For example, while principally described below in conjunction with 2-way Doherty architectures, the following teachings are equally applicable to Doherty PA assemblies having N-way Doherty architectures (N>2). Additionally, embodiments of the present disclosure are broadly applicable to various types of Doherty PA circuits regardless of the particular die or transistor technologies employed.

General Discussion of an Example Doherty PA Circuit Including an Integrated Output Combining Network FIG. 1 is a schematic diagram of a Doherty PA system 10, as illustrated in accordance with an example embodiment of the present disclosure. Doherty PA system 10 includes an input terminal or node 12 and an output node or terminal 14 between which a power divider 16, a carrier (or "main") signal amplification path 18, a peaking (or "auxiliary") signal amplification path 20, and a combining node 24 are provided. When an RF input signal is applied to input node 12, a divider input node 22 contained in power divider 16 splits the RF input signal into a carrier signal and a peaking signal, which are then transmitted in parallel along carrier signal amplification path 18 and peaking signal amplification path 20, respectively, for separate amplification. Various additional components or circuit elements are also positioned in carrier and peaking signal amplification paths 18, 20 including, pertinently, a carrier amplifier 26 and a peaking amplifier 28. Specifically, carrier amplifier 26 and peaking amplifier 28 are positioned in carrier signal amplification path 18 and peaking signal amplification path 20, respectively, between power divider 16 and combining node 24. Following signal amplification by amplifiers 26, 28, the carrier and peaking signals are further conducted along signal amplification paths 18, 20 and are ultimately combined at combining node 24 to yield a consolidated RF output signal. The consolidated RF signal is then transmitted to output terminal 14 and applied an electrical load 30 driven by Doherty PA system 10. Electrical load 30 can include or assume the form of, for example, one or more antennae in embodiments in which Doherty PA system 10 is employed in a base station or other wireless communication system.

Doherty PA system 10 is imparted with a standard load network configuration in the illustrated example. Accordingly, the pre-amplifier circuit section of Doherty PA system 10 introduces a controlled phase delay to the peaking signal transmitted along peaking signal path 20 relative to the carrier signal transmitted along carrier signal path 18 at the center frequency of operation (fo). This phase delay is implemented as a quarter wave ($\lambda/4$) or 90 degree phase delay in the example embodiment of FIG. 1. To ensure arrival of the carrier and peaking input RF signals at amplifiers 26, 28 with 90 degrees of phase difference at the inputs of amplifiers 26, 28, a phase delay element 32 is incorporated into the Doherty PA system 10 and configured to apply the 90 degree phase delay to the peaking input signal. Phase delay element 32 may include, for example, a quarter wave ($\lambda/4$) transmission line providing a 90 degree phase shift or delay to the peaking input signal relative to the carrier input signal. In the illustrated example, phase delay element 32 is contained in the dashed box representative of power divider 16 to indicate that phase delay element 32 may be combined with power divider 16 as a single, commercially-available component, such as a hybrid coupler, in embodiments. In other implementations, phase delay element 32 and power divider 16 may be realized as physically distinct devices mounted to a common PCB or other substrate. Additionally, if desired, at least one phase shifter 34 may be provided in either or both of carrier and peaking signal amplification paths 18, 20 to allow the fine-tuning or incremental adjustment of phase shifts.

Two PCB-level input MNs 36 are further included in Doherty PA system 10 and positioned in signal amplification paths 18, 20 in the embodiment of FIG. 1. PCB-level input MNs 36 function to raise the input impedance of Doherty PA package 38 to a higher target impedance level, such as an impedance in the range of about 2 to about 10Ω. This may enable a PBC-level matching interface from a non-illustrated driver stage to have an impedance achieved in high-volume manufacturing with minimal loss and variation. PCB-level input MNs 36 may be included in a Doherty PA device along with power divider 16 and amplifiers 26, 28 in embodiments in which the Doherty PA device assumes the form of a module. This is generically indicated in FIG. 1 by dashed box 40, which encompasses various components of Doherty PA system 10 (including an output combining network) potentially contained in a Doherty PA module, such as the example Doherty PA module described below in connection with FIG. 6 corresponding to dashed box 40 (FIG. 1). In other instances, Doherty PA system 10 may be constructed to include a Doherty PA package containing the components encompassed by dashed box 38 in FIG. 1. An example of a Doherty PA package (including an output combining network) corresponding to dashed box 38 is described below in connection with FIGS. 4 and 5.

With continued reference to FIG. 1, a first pre-amplifier input MN 42 is positioned in carrier signal amplification path 18 and electrically coupled between a first node 44 of Doherty PA system 10 and carrier amplifier 26, while a second pre-amplifier input MN 46 is positioned in peaking signal amplification path 20 and electrically coupled between a second node 48 of Doherty PA system 10 and peaking amplifier 28. The particular manner in which pre-amplifier input MNs 42, 46 (when provided) are implemented will vary between embodiments. In the illustrated implementation, specifically, pre-amplifier input MNs 42, 46 are each imparted with a T-match configuration including a number of inductive elements 50, 52, 54, and shunt capacitive elements 56, 58. Inductive elements 50, 52, 54 may be realized as bond wires or integrated spiral inductors, while the capacitive elements 56, 58 may be realized utilizing integrated passive capacitors in embodiments. Other embodiments may include pre-amplifier input MNs 42, 46 having other circuit topologies and/or forming other filter types. In implementations in which Doherty PA system 10 is fabricated to include a Doherty PA package 38, nodes 44, 48 may represent the carrier input lead and the peaking input lead of package 38, respectively.

An input-side harmonic termination circuit may be provided in either or both of signal amplification paths 18, 20. In the illustrated example, such an input harmonic termination circuit 60 is provided in both of signal amplification paths 18, 20, with first and second termination circuits 60 positioned between pre-amplifier input MNs 42, 46 and amplifiers 26, 28, respectively. Harmonic termination circuits 60 may have various constructions suitable for removing or minimizing signal energy at a targeted harmonic frequency, typically the second order harmonic frequency (2fo) of the carrier and peaking signals. Each input harmonic termination circuit 60 may include an inductive element 62, which is electrically coupled to ground (or other reference voltage) through a capacitive element 64 (thus providing a shunt capacitance). By varying the values of inductive element 62 and capacitive element 64, each input harmonic termination circuit 60 can be tuned to terminate the signal energy at the targeted (e.g., 2fo) harmonic frequency prior to transmission of the signal to carrier amplifier 26 or peaking amplifier 28. Amplifier performance is enhanced as a result. This notwithstanding, input harmonic termination circuits 60 may be omitted from Doherty PA system 10 in other embodiments.

Carrier amplifier 26 and peaking amplifier 28 each include at least one power transistor integrated circuit (IC) for amplifying RF signals conducted through amplifiers 26, 28. Each power transistor IC may be fabricated on a semiconductor die and imparted with either a single-stage or multi-stage transistor configuration. In implementations, all amplifier stages (or at least a final amplifier stage) of carrier amplifier 26 and/or peaking amplifier 28 may be implemented utilizing any of the following FET technologies: silicon-based FETs (e.g., as laterally-diffused metal oxide semiconductor FETs or "LDMOS" FETs) or III-V FETs (e.g., as gallium nitride (GaN) FETs, gallium arsenide (GaAs) FETs, gallium phosphide (GaP) FETs, indium phosphide (InP) FETs, or indium antimonide (InSb) FETs, or as another type of III-V transistor). The carrier and peaking transistor ICs may be equally sized when, for example, Doherty PA system 10 is imparted with a symmetric Doherty configuration in which the carrier and peaking transistor ICs have substantially equal current-carrying capabilities or active peripheries. Alternatively, the carrier and peaking transistor ICs may have unequal sizes (or current-carrying capabilities) in the case of various asymmetric Doherty configurations; it being understood that the term "size," as appearing in this context, is utilized in reference to the active periphery or total active gate width of the power transistor ICs. In an asymmetric Doherty configuration, specifically, the peaking transistor IC(s) may be larger than the carrier transistor IC(s) by some multiplier. For example, the peaking transistor IC(s) may be twice the size of the carrier transistor IC(s) such that the peaking transistor IC(s) have approximately twice the current carrying capability of the carrier transistor IC(s). Peaking-to-carrier amplifier IC size ratios other than a 2:1 ratio may be implemented, as well.

For convenience of explanation, and to reflect the fact that FETs are predominately utilized in the production of Doherty PA circuits at present, the following description principally focuses on implementations of the Doherty PA circuits and assemblies implemented utilizing FET technologies. It is emphasized, however, that alternative embodiments of the present disclosure can be implemented utilizing other transistor types including, but not limited to, bipolar transistors. Thus, while carrier amplifier 26 and peaking amplifier 28 are schematically illustrated and described below as containing single stage FET architectures in the non-limiting example of FIG. 1, Doherty PA system 10 can be implemented utilizing other transistor technologies and/or amplifiers 26, 28 may include multiple amplifier stages in alternative implementations. Additionally, while Doherty PA system 10 is imparted with a 2-way Doherty architecture in the illustrated example, Doherty PA system 10 may have a more complex N-way Doherty architecture (N>2) in further implementations (in which case the below-described circuitry may be repeated or combined for additional signal carrying paths, as appropriate). For example, in such implementations, Doherty PA system 10 may include additional signal amplification paths, such two parallel peaking signal amplification paths (in the case of a 3-way Doherty PA circuit) or three parallel peaking signal amplification paths (in the case of a 4-way Doherty PA circuit). Generally, then, it should be understood that the present teachings are equally applicable to various Doherty architectures independent of the transistor or die technology employed and regardless of the number of signal-conducting paths within the Doherty PA circuit (providing the Doherty PA circuit includes at least one carrier signal amplification path and at least one peaking signal amplification path).

Carrier amplifier 26 of Doherty PA system 10 is biased to function in class AB mode, while peaking amplifier 28 is biased to function in class C mode. At low power levels when the power of the input signal at input node 12 is less than the turn-on threshold level of peaking amplifier 28, Doherty PA system 10 operates in a low-power or back-off mode. In the low-power (back-off) mode, carrier amplifier 26 is typically the only amplifier supplying current to load

30. When the power of the input signal exceeds a threshold level of peaking amplifier 28, however, Doherty PA system 10 transitions to operation in a high-power mode in which peaking amplifier 28 and carrier amplifier 26 supply current to load 30 concurrently. Peaking amplifier 28 provides active load modulation at combining node 24, thereby allowing a continued, linear increase in the current of carrier amplifier 26. When Doherty PA system 10 operates in a full-power mode, power divider 16 may apportion power in a substantially equal manner when the illustrated system 10 is imparted with a symmetric Doherty PA configuration, such that approximately one half of the input signal power is provided to each signal amplification path 18, 20. In other instances, such as when the illustrated system 10 is imparted with an asymmetric Doherty PA configuration, power divider 16 may apportion power unequally between the signal PA paths 18, 20 in the high-power mode.

In various implementations, amplifiers 26, 28 may each include a single-stage or multi-stage power transistor die(s) bonded to a PCB or other substrate, with any suitable die and transistor technologies employed. In the illustrated embodiment, and by way of example only, amplifiers 26, 28 are each illustrated as a single stage FET. Accordingly, and as schematically indicated in FIG. 1, the FET included in carrier amplifier 26 includes a control or gate terminal 66, a drain terminal 68 (generally, an output terminal or pad), and a source terminal 70 electrically coupled to ground or another reference voltage. Additionally, as indicated in FIG. 1 by capacitance 72, the carrier FET has an inherent output capacitance between its drain and source ($Cds_C$). Similarly, the carrier FET included in peaking amplifier 28 includes a control or gate terminal 74, a drain terminal 76, and a source terminal 78. The peaking FET likewise has an output capacitance between its drain and source ($Cds_P$), as indicated by capacitance 80. The output terminal of carrier amplifier 26 is coupled to a node 82 included in a first output harmonic termination circuit 84, while the output terminal of peaking amplifier 26 is coupled to a node 86 included in a second output harmonic termination circuit 88, as described below. Harmonic termination circuits 84, 88 each include an inductive element 90 and shunt capacitance 92 forming an LC circuit structure. Specifically, inductive element 90 of harmonic termination circuit 84 (e.g., realized using, for example, one or more bond wires) is electrically coupled between node 82 (and therefore drain terminal 68 of carrier amplifier 26) and shunt capacitance 92 (e.g., realized as an integrated or discrete capacitor), which is, in turn, electrically coupled to ground or another reference voltage. In a similar manner, inductive element 90 of harmonic termination circuit 88 electrically coupled between node 86 (and therefore drain terminal 76 of peaking amplifier 28) and a shunt capacitance 92. Inductive elements 90 are thus tuned to resonate at the targeted harmonic (typically 2fo) in a manner discharging excess energy at the targeted harmonic through capacitive elements 92 and to ground.

The 90 degree phase delay between the signals conducted along amplification paths 18, 20 arriving at the inputs of amplifiers 26, 28 is subsequently resolved in the output combining network to ensure that the amplified signals arrive in phase at combining node 24. For example, the post-amplifier section of Doherty PA system 10 may be configured to apply a 90 degree phase delay to the signal between the output of peaking amplifier 28 and combining node 24. This may be achieved, at least in part, through the provision of an additional phase delay element 94 electrically coupled between an output of peaking amplifier 28 and combining node 24. In accordance with embodiments of the present disclosure, phase delay element 94 may be bond wires having a design-determined cumulative or "lump" inductance, as indicated in FIG. 1 by symbol 96. Further description of example manners in which phase delay element 94 may be physically realized in the form of one or more bond wires is described below in connection in connection FIGS. 2-6. From combining node 24, the consolidated RF output signal is further transmitted through a final inductive element 98 (e.g., one or more die-to-substrate bond wires) and a final impedance transformer 100 (e.g., provided via a microstrip transmission line) to raise the impedance of the RF output signal prior to application to load 30 through output terminal 14. In certain embodiments, impedance transformer 100 may raise the impedance of the RF output signal to the load impedance plane, thereby reducing, if not eliminating the need for additional impedance transformation downstream of the Doherty PA system 10. As a specific example, in instances in which the previously-identified components of Doherty PA circuitry 10 are contained in a Doherty PA package 38, the need for additional impedance transformation downstream of package 38 may be avoided.

Collectively, the foregoing components (particularly, inductance 96, shunt capacitance 92, phase delay element 94, combining node 24, inductance 98, and impedance transformer 100) combine to form an integrated combining output network 102; the term "integrated" indicating that the combining output network 102 is incorporated into the Doherty PA device or assembly. Integrated combining output network 102 performs those functions typically performed by circuitry downstream of a Doherty PA package, including: (i) compensating for phase shift downstream of amplifiers 26, 28 to ensure that the carrier and peaking signals transmitted along paths 18, 20 arrive at combining node 24 in phase, (ii) providing output-side impedance matching downstream of amplifiers 26, 28, and (iii) providing harmonic termination of signal energy at, for example, 2f0 (the 2fo harmonic termination provided by elements 96, 98). In so doing, the circuit structure shown in FIG. 1 reduces the number of components and overall size of the substrate to which Doherty PA package 38 is mounted in embodiments (noting, again, that the illustrated circuit structure can be implemented as a module in other implementations). Further, Doherty PA system 10 may enhance BW and minimize combining losses due, at least in part, to low-loss quasi-transformation of the carrier output signal conducted along path 20 and through integrated combining output network 102. In embodiments, high-Q bond wires may provide a connection between carrier and peaking amplifier dies, which are strategically oriented or physically positioned to provide a reduced length path between a carrier amplifier die bearing transistor amplifier 28 and combining node 24. Again, combining node 24 may be physically provided on a peaking amplifier die bearing peaking amplifier 28, as further discussed below. With these benefits in mind, example implementations of the carrier amplifier die, the peaking amplifier die, and the various circuit components forming integrated combining output network 102 will now be described in connection with FIGS. 2 and 3.

Figure 2:
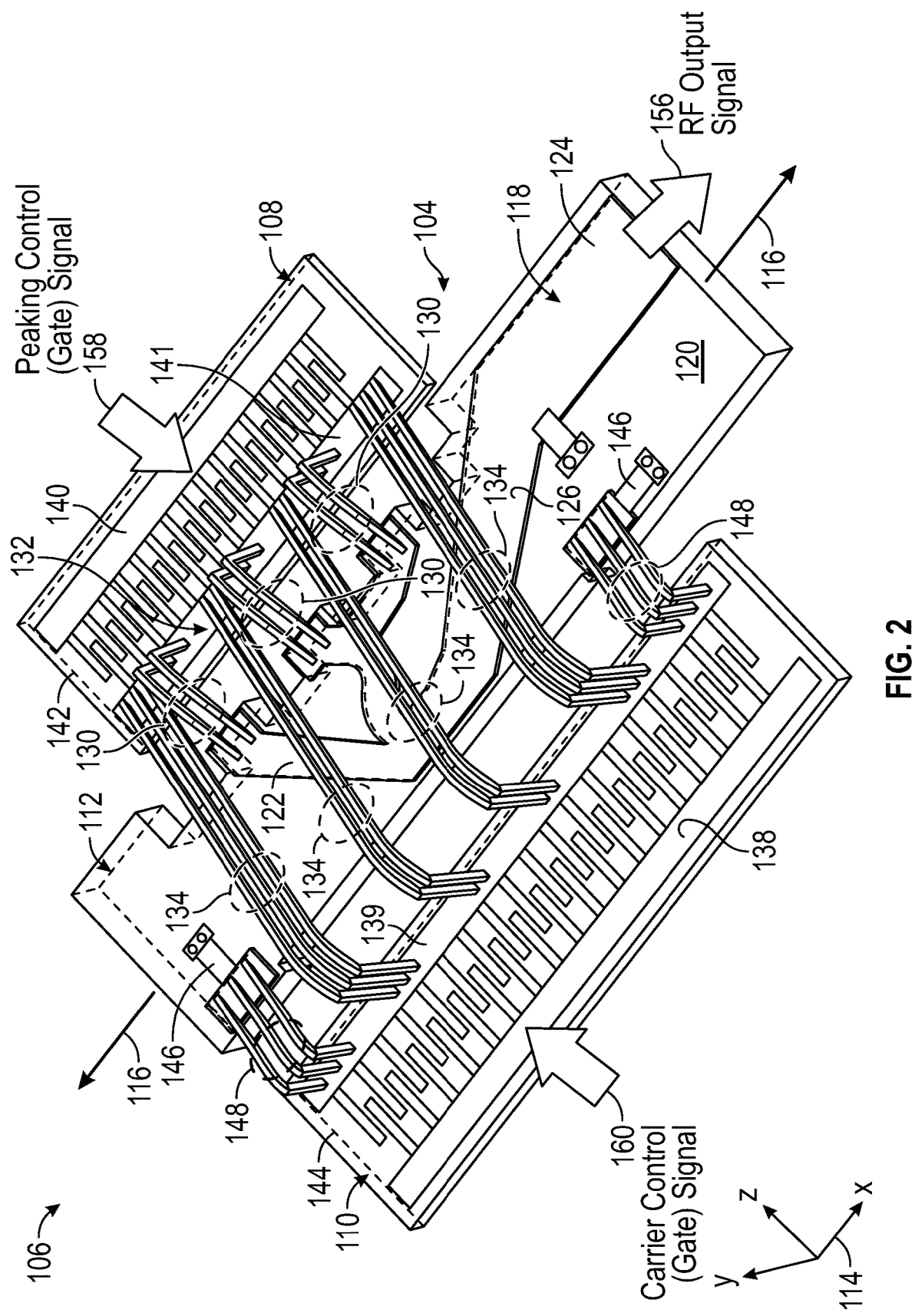
FIGS. 2 and 3 are isometric and planform (top-down) views illustrating one manner in which the integrated combining output network and other surrounding components of the Doherty PA device shown in FIG. 1 may be physically implemented in an embodiment.
Figure 3:
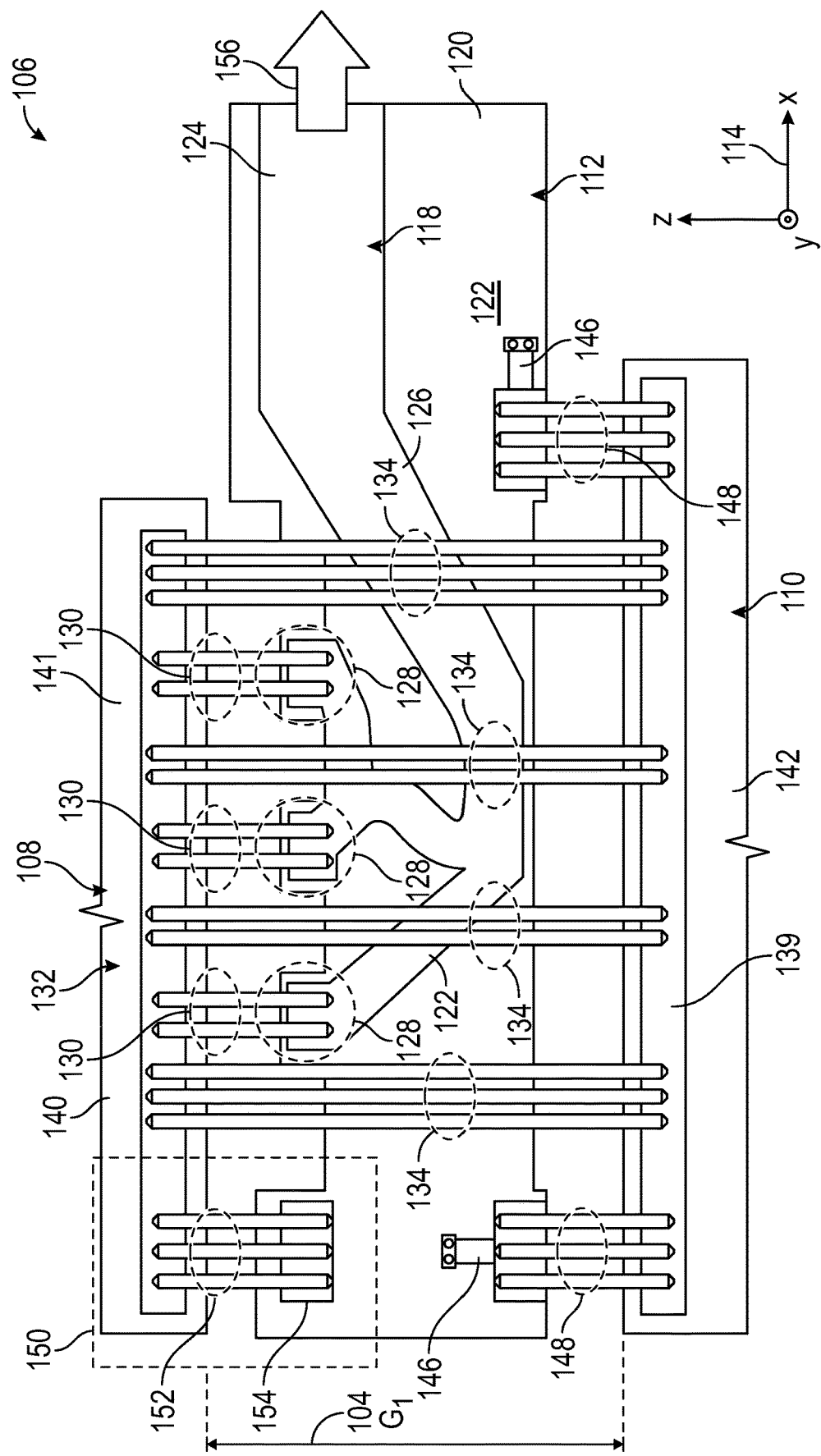

Example Implementation of the Integrated Output Combining Networks and Other Central Structural Features of the Doherty PA Devices FIGS. 2 and 3 are isometric and planform (top-down) views illustrating one manner in which integrated combining output network 102 and certain other surrounding components of Doherty PA device 38, 40 shown in FIG. 1 may be physically implemented in an example embodiment. The arrangement shown in FIGS. 2 and 3 is referred to hereafter as a "central Doherty amplifier-combiner structure 106." According to embodiments, Doherty PA device 38, 40 includes a carrier amplifier die 110 having at least one carrier transistor (e.g., FET) formed thereon, a peaking amplifier die 108 having at least one peaking transistor (e.g., FET) formed thereon, and a substrate 112 on which a transmission line 118, such as a microstrip transmission line, is provided. Transmission line 118 includes, in turn, an input end portion 122, an output end portion 124, and an intermediate portion 126 between end portions 122, 124. Output end portion 124 of transmission line 188 is positioned between amplifier dies 108, 110, as taken along a lateral axis of Doherty PA device 38, 40 (corresponding to the Z-axis of coordinate legend 114 shown in the lower left of FIGS. 2-3). In view of this positioning, input end portion 122 of transmission line 118 may also be referred to as "die-interposed input end portion 122," noting that input end portion 122 may be located at different elevation than are the respective frontsides of amplifier dies 108, 110. During operation, transmission line 118 conducts an amplified RF output signal to an output terminal of Doherty PA device 38, 40, while raising the impedance of the RF output signal to a desired level. Further description of transmission line 118 and the other features of central Doherty amplifier-combiner structure 106 are described, in turn, below. First, however, amplifier dies 108, 110 are described in greater detail to provide a non-limiting example context in which embodiments of integrated combining output network 102 may be better understood.

Carrier amplifier die 110 includes an input/gate terminal 138, an output/drain terminal in the form of an elongated drain manifold 139, and a single-stage or multiple-stage power amplifier connected between input terminal 138 and output terminal/drain manifold 139. Input/gate terminal 138 may be an elongated bond pad electrically connected to the input or gate of a carrier power transistor embodied in carrier amplifier die 110), while elongated drain manifold 139 may be elongated bond pad electrically connected to the output of drain of a carrier power transistor embodied in carrier amplifier die 110. Similarly, peaking amplifier die 108 includes an input/gate terminal 140 (e.g., a bond pad electrically connected to the input or gate of a peaking power transistor embodied in peaking amplifier die 108), an output/drain terminal in the form of an elongated drain manifold 141 (e.g., a bond pad electrically connected to the output of drain of a peaking power transistor embodied in peaking amplifier die 108), and a single-stage or multiple-stage power amplifier connected between input terminal 140 and output terminal/drain manifold 141. As described below, output terminal/drain manifold 141 of peaking amplifier die 108 also functions as the combining node 132 of the Doherty amplifier-combiner structure 106. Carrier and peaking amplifier dies 108, 110 are oriented in a "head-to-head" orientation in which elongated drain manifolds 139, 141 of carrier and peaking amplifier dies 108, 110 have their longest dimensions (i.e., their lengths along the X-axis of coordinate legend 114) oriented in parallel, with a spatial offset or lateral gap 104 between dies 108, 110. At least a portion of substrate 112 may be positioned within die-to-die gap 104, as seen looking downwardly onto substrate 112 along an axis orthogonal to frontside 120 of substrate 112 (corresponding to the Y-axis of coordinate legend 114). Output terminal/drain manifold 139 of carrier amplifier die 110 is electrically connected to output terminal/drain manifold 141 of peaking amplifier die 108 (and therefore to combining node 132) with bond wires 134 extending over substrate 112.

The upper surface or frontside 120 of substrate 112 may be located at substantially the same elevation, below, or above the respective upper surfaces or frontsides of dies 108, 110, as taken along an axis orthogonal to the upper surface of substrate 112. The illustrated portion of substrate 112 may be part of a lager structure, such as an interposer or PCB of the type described below in connection with FIGS. 4-6. As may dies 108, 110, substrate 112 may have a generally rectangular planform shape, which is elongated along a longitudinal axis 116 (identified in FIG. 2 and corresponding to the X-axis of legend 114). In other instances, the dimensions and planform geometry of substrate 112 may vary. Generally, in embodiments in which central Doherty amplifier-combiner structure 106 is integrated into a Doherty PA package, substrate 112 may be a discrete PCB or similar electrically-routed substrate included within the package body, as described more fully below in connection with FIGS. 4 and 5. Alternatively, in embodiments in which central Doherty amplifier-combiner structure 106 is integrated into a Doherty PA module, substrate 112 may be discrete substrate or, instead, a section of a larger PCB to which dies 108, 110 are mounted, as discussed below in conjunction with FIG. 6. In either instance, substrate 112 includes at least one transmission line 118, such as a microstrip transmission line, formed on frontside 120 of substrate 112. Whether attached to substrate 112 in some manner or located next to substrate 112, amplifier dies 108, 110 may be described as positioned adjacent substrate 112 and input end portion 122 of transmission line 118, as described below.

As previously noted, transmission line 118 includes a multi-pronged (e.g., trifurcated) input end portion 122, an output end portion 124, and an intermediate portion 126 between end portions 122, 124. Input end portion 122 may be patterned or otherwise fabricated to include a number of bond pad or landing pad features 128 (identified in FIG. 3) contacted by die-to-substrate bond wires 130 arranged in an equal number of bond wire arrays. Specifically, die-to-substrate bond wires 130 each include a first end and a second end. The first end of each die-to-substrate bond wire 130 contacts and is bonded to landing pads 128 provided on substrate 112. The second, opposing end of each bond wire 130 contacts and is bonded to the drain manifold 141/ combining node 132, which is provided on peaking amplifier die 108. Combining node 132 is integrated with (that is, formed as a single or monolithic structure with) the output terminal or drain manifold 141 of peaking amplifier die 108 in the illustrated example; however, in other instances, combining node 132 may be formed as a discrete metal layer or body on peaking amplifier die 108, which is electrically coupled to drain manifold 141 further provided on die 108. As described more fully below, integration of combining node 132 onto peaking amplifier die 108 enables a 90/0 topology in which 90 degrees of phase delay is introduced between the carrier current generator (i.e., the drain terminal of the output-stage transistor integrated within carrier amplifier die 110, which is connected to carrier drain manifold 139) and combining node 132; e.g., utilizing one or more die-to-die bond wires 134. Comparatively, essentially 0 degrees of electrical delay is applied between the peaking current generator (i.e., the drain terminal of the output-stage transistor integrated within peaking amplifier die 108, which is connected to peaking drain manifold 141) and combining node 132.

As formed in input end portion 122 of transmission line 118, landing pad features 128 (FIG. 3) may be formed on frontside 120 at a location distributed alongside an edge of substrate 112. This edge of substrate 112 is further positioned adjacent the edge of peaking amplifier die 108 on which peaking drain manifold 141/combining node 132 is located. Consequently, the distance between landing pad features 128 and drain manifold 141/combining node 132 of peaking amplifier die 108, as taken along axes parallel to the lateral axis (corresponding to the Z-axis of coordinate legend 114), is less than the distance between landing pads 128 and to carrier drain manifold 139 of carrier amplifier die 110. This positioning enables the respective lengths of die-to-substrate bond wires 130 to be minimized for additional space savings and low loss performance. Comparatively, a number of die-to-die bond wires 134 further contact peaking drain manifold 141/combining node 132 and contain bond wires having lengths greater than die-to-substrate bond wires 130. In particular, die-to-die bond wires 134 have first ends bonded to peaking drain manifold 141/combing node 132 on peaking amplifier die 108 and second ends bonded to an output terminal (here, a drain manifold 139) of carrier amplifier die 110. As a corollary, combining node 132 is physically located between an input terminal (here, a gate terminal 138) of carrier amplifier die 110 and an input terminal (a gate terminal 140) of peaking amplifier die 108, as further taken along the lateral axis. Similarly, combining node 132 is located: (i) between substrate 112 and gate terminal 140 of peaking amplifier die 108, as taken along the lateral axis; and (ii) between drain manifold 139 of carrier amplifier die 110 and gate terminal 140 of peaking amplifier die 108, as taken along the lateral axis. Stated differently, drain manifolds 139, 141 each extend substantially parallel to a first axis (axis 116) and are located between gate manifolds 138, 140 as taken along a second axis (corresponding to the Z-axis of coordinate legend 114) perpendicular to the first axis.

In the illustrated example, central Doherty amplifier-combiner structure 106 further includes additional shunt capacitance elements 146 attached to frontside 120 of substrate 112 or integrally formed within substrate 112. Such shunt capacitance elements 146 may be, for example, integrated passive capacitors coupled to or provided within substrate 112 and electrically coupled to ground (or another reference voltage) through substrate 112. Shunt capacitance elements 146 include first terminals (or first capacitor plates) electrically coupled to drain manifold 139 of carrier amplifier die 110 through bond wires 148. These elements 146, 148 may be tuned to provide harmonic terminations, such as 2fo terminations, to improve carrier efficiency and other performance parameters. Elements 146, 148 are therefore beneficially, although non-essentially integrated into central Doherty amplifier-combiner structure 106 as depicted. Moreover, and as exclusively shown in region 150 of FIG. 3, a similar lump inductance or bond wire array 152 may be provided between drain manifold 141/combining node 132 of peaking amplifier die 108 and a shunt capacitance element 154 further provided on substrate 112. Again, bond wire array 152 and shunt capacitance element 154 cooperate to form an LC circuit tuned for harmonic termination.

As indicated above, integration of combining node 132 onto peaking amplifier die 108 enables a 90/0 topology in which 90 degrees of phase delay is introduced between the carrier current generator and the combining node 132, while 0 degrees of electrical delay is applied between the peaking current generator and the combining node 132. Such a topology may effectively eliminate the need for an output-side peaking MN in embodiments, while bringing combining node 132 to the reference plane of peaking amplifier die 108. The circuitry components connecting combining node 132 to drain manifold 139 of carrier amplifier die 110 and to output end 124 of transmission line 118 are therefore beneficially configured to provide optimal impedance matching to peaking amplifier die 108. Further, in order to bring the consolidated RF signal to the electrical load, the low impedance at which the peaking amplifier die 108 operates may be increased by leveraging transmission line 118 and die-to-substrate bond wires 130 as an impedance transformer 118, 130; e.g., impedance transformer 100 (FIG. 1). In this manner, a low-loss compact Doherty transformer can be realized, while utilizing planar transmission line 118 to transmit the consolidated RF signal to the output node or terminal of the Doherty PA circuit (indicated in FIGS. 2 and 3 by arrow 156).

Impedance transformer 118, 130 is designed to provide an impedance transformation seen at combining node 132 to a higher value and, perhaps, the impedance of the electrical load to which the Doherty PA circuit is coupled; e.g., as an example, transformer 118, 130 may raise the output impedance to a predetermined impedance value equivalent to the reference plane of an antenna (or other load) included in a wireless communication system. In embodiments, the predetermined impedance value may range from 40 to 60Ω; and, in certain cases, may be substantially equivalent to 50Ω. Such an impedance transformation may be predominately achieved by planar transmission line 118, which is imparted with an appropriate electrical resistance and shaping (planform geometry and thickness) to impart line 118 with a characteristic impedance for performing this function. The need for output-side PCB matching is thus significantly reduced or eliminated. This may enable the elimination of (or a reduced reliance on) additional PCB-mounted components and substrate space downstream of the Doherty PA device, thereby reducing additional component-to-component interfaces for decreased complexity and loss reduction for increased performance. Additionally, the PCB footprint can be greatly reduced (e.g., by 40% or more) in many instances.

Comparing the circuit components shown in the example FIGS. 2-3 with the circuit elements schematically shown in FIG. 1, peaking amplifier die 108 (FIGS. 2-3) includes the various circuit components shown in box 26 (FIG. 1), with $Cds_P$ denoting the drain-source capacitance of peaking amplifier die 108. Additionally, output terminal 76 (FIG. 1) corresponds to drain manifold 141 (FIGS. 2-3), while combining node 24 (FIG. 1) corresponds to combining node 132 (FIGS. 2-3) integrally formed with drain manifold 141. Similarly, carrier amplifier die 110 (FIGS. 2-3) includes the various circuit components shown in box 28 (FIG. 1), with $Cds_C$ denoting the drain-source capacitance of carrier amplifier die 110. Additionally, drain manifold 139 of carrier amplifier die 110 (FIGS. 2-3) corresponds to output terminal 68 shown in FIG. 1. Impedance transformation provided by the combination of bond wires 130 and transmission line 118 (FIGS. 2 and 3) correspond to lump inductance 98 and impedance transformation 100 shown in FIG. 1. Inductance 90 and capacitance 92 in carrier signal path 18 are provided by bond wires 148 and capacitors 146, respectively; while inductance 90 and capacitance 92 located in peaking signal path 20 are provided by bond wires 152 and capacitor 154 shown exclusively in FIG. 3. Finally, phase delay element 94 including inductance 96 is principally provided by die-to-die bond wires 134 (FIGS. 1 and 2), which electrically couple drain manifold 139 of carrier amplifier die 110 to drain manifold 141/combining node 132 of peaking amplifier die 108.

Doherty PA device 38, 40 may have a symmetric or an asymmetric design, depending upon implementation. Further, the carrier and peaking amplifier dies 108, 110 may utilize the same semiconductor technologies or different semiconductor technologies. For example, the carrier and peaking amplifier dies 108, 110 may both comprise silicon-based LDMOS FETs or GaN-based FETs. Alternatively, the carrier amplifier die 110 may comprise silicon-based LDMOS FET(s), while the peaking amplifier die 108 may comprise GaN-based FET(s) in a "hybrid" design. As is known to those of skill in the art, a GaN-based FET may be smaller in size (or transistor periphery) than an LDMOS FET that has the same current-carrying capability. Accordingly, for a symmetric or an asymmetric design that includes a carrier amplifier comprising LDMOS FET(s) and a peaking amplifier comprising GaN FET(s), the relative size of the peaking amplifier may be smaller than the size of the carrier amplifier, while still having the same current-carrying capacity as the carrier amplifier (in a symmetric design) or a higher current-carrying capacitor (in an asymmetric design). In the illustrated example, the Doherty amplifier is imparted with a symmetric or an asymmetric design including a FET-bearing peaking amplifier die 108 with a relatively-small peaking transistor periphery, along with a FET-bearing carrier amplifier die 110 with a relatively-large carrier transistor periphery.

While the illustrated example depicts Doherty PA device 38, 40 as having a design in which peaking amplifier die 108 is smaller than carrier amplifier die 110, other embodiments of the Doherty PA device may have equal-sized carrier and peaking amplifier die 108, 110, or they may have a peaking amplifier die 108 larger than the carrier amplifier die 110. Further, other embodiments may incorporate other types of die technologies in either symmetric or asymmetric Doherty designs. It will be noted, however, that the usage of relatively small peaking amplifier dies (e.g., die 108) may help reduce size, while asymmetric Doherty designs permit an increase in the current-carrying capacity of the peaking transistor relative to the carrier amplifier to bring about potential improvements in the gain, linearity, stability, and power-added efficiency levels of the Doherty PA device. Various other structural components will be included in the Doherty PA device incorporating central Doherty amplifier-combiner structure 106. Such other structural components will vary in relation to various design considerations, such as the inclusion or exclusion of bias circuitry, whether a 2-way or N-way Doherty architecture (N>2) is employed, and whether central Doherty amplifier-combiner structure 106 is integrated into a Doherty PA package (e.g., such as the package described below in connection with FIGS. 4 and 5) or a Doherty PA module (e.g., such as the module described below in connection with FIG. 6).

Examples of Doherty PA Packages Having Integrated Combining Output Networks

Figure 4:
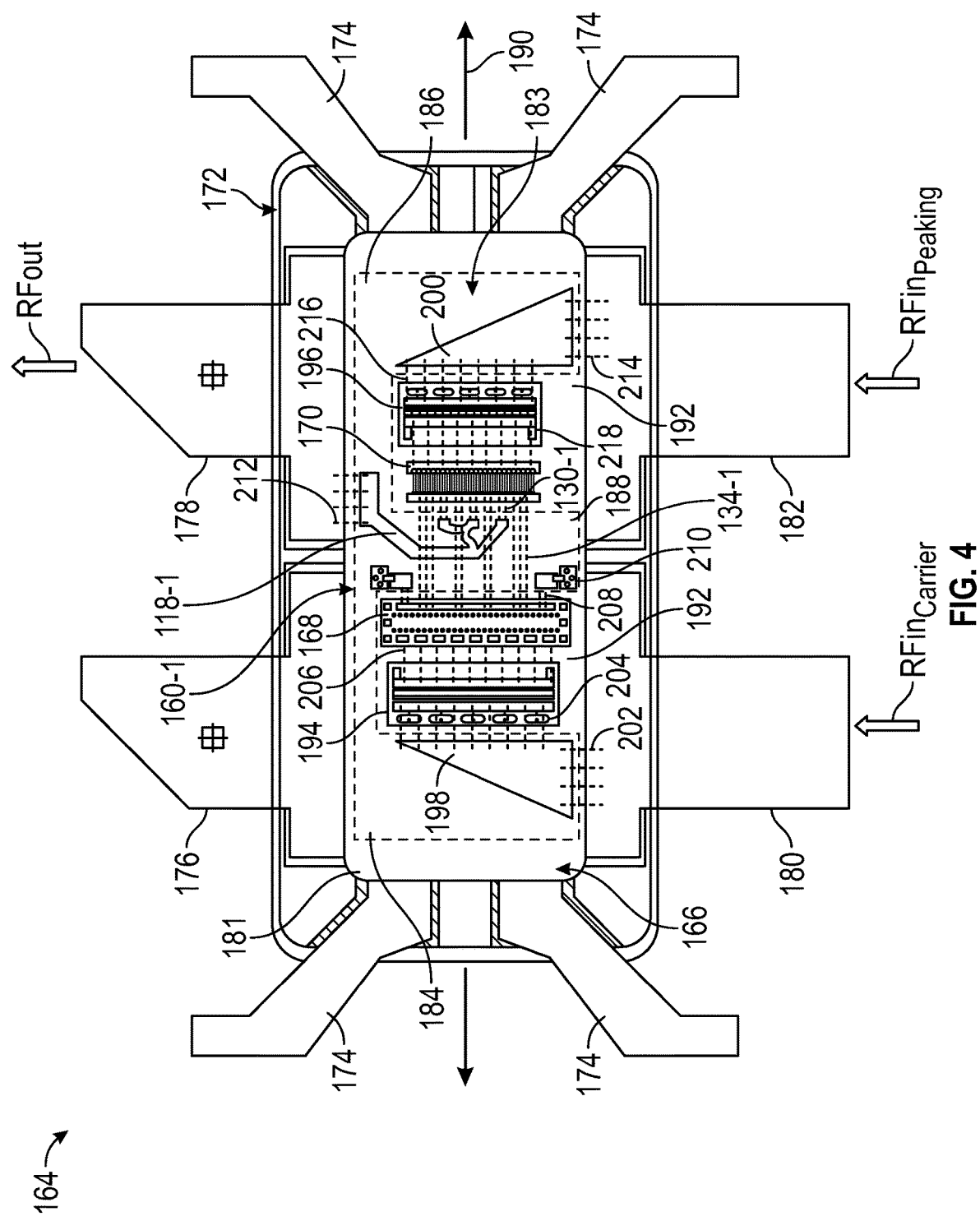
FIG. 4 is a generalized planform view of a first example Doherty PA device, which incorporates the example integrated combining output network shown in FIGS. 2-3 and which assumes the form of a discrete microelectronic package having a standardized lead layout.

Turning to FIG. 4, a generalized planform view of an example Doherty PA device in the form of a Doherty PA package 164 is presented. In accordance with the foregoing description, the Doherty PA package 164 includes (among other components) a central Doherty amplifier-combiner structure 106-1 providing carrier and peaking signal amplification, output-side impedance matching, harmonic termination, and RF output signal reconsolidation. As appearing herein, the suffix "-1" denotes that central Doherty amplifier-combiner structure 106-1 is an example version of central Doherty amplifier-combiner structure 106 shown in FIGS. 2-3 when integrated into an example Doherty PA device (here, Doherty PA package 164 shown in FIG. 4). Central Doherty amplifier-combiner structure 106 is consequently similar, if not substantially identical to either embodiment of central Doherty amplifier-combiner structure 106 (FIGS. 2 and 3), but with modifications applied where appropriate to enable integration into example Doherty PA package 164. This numbering convention is further utilized below in identifying certain elements of central Doherty amplifier-combiner structure 106-1 and when discussing additional example variations of central Doherty amplifier-combiner structure 106 in conjunction with FIGS. 5 and 6.

In the example of FIG. 4, Doherty PA package 164 assumes the form of an air cavity package shown in a partially-fabricated state. Specifically, Doherty PA package 164 is shown at a stage of manufacture preceding the attachment of a cover piece or lid to visually reveal the interior of package 164, which includes an air cavity 166 in which a carrier amplifier die 168 and a peaking amplifier die 170 are housed. Air cavity 166 is subsequently enclosed via attachment of a cover piece to trap a desired pressure and gas (which may be "air" or another inert gas) within the interior of package 164. This example notwithstanding, the following description is applicable to various different microelectronic package types amenable to usage in the fabrication of Doherty PA packages including, for example, encapsulated or over-molded packages lacking air (gas-containing) internal cavities. Doherty PA package 164 further includes a package body 172 from which a number of leads 174, 176, 178, 180, 182 project. The package leads include a plurality of bias leads 174, a carrier input lead 180, a peaking input lead 182, a single RF signal output lead 178, and an unused or dummy lead 176. Generally considered, the lead layout shown in FIG. 4 is standardized and resembles other commercially-available two-way Doherty PA packages, as seen from the package exterior. However, as RF signal consolidation is performed within Doherty PA package 164, only a single, consolidated RF signal is transmitted from package 164, here via lead 178. Such a standardized lead layout may facilitate integration of Doherty PA package 164 into existing customer modules or systems.

Amplifier dies 168, 170 are mounted to a floor of the package interior defining air cavity 166. For example, amplifier dies 168, 170 may be mounted to the upper surface or frontside a base flange 181, such as a metal block or laminated metallic structure forming the bulk of the lower portion of Doherty PA package 164. Base flange 181 may serve as a heatsink and as an electrically-conductive terminal (e.g., a ground terminal) of Doherty PA package 164. Package body 172 may be principally constructed from base flange 181 and certain other material components (e.g., a window frame or an over-molded material) defining the package sidewalls, bond pad shelves, and other structural features of Doherty PA package 164. As drawn in phantom line in FIG. 4, a PCB 183 (or other substrate) is further embedded in Doherty PA package 164. PCB 183 can be imparted with various shapes to fit within package 164, preferably while permitting dies 168, 170, and perhaps devices 194, 196 if implemented as discrete (die-carried) components rather than as integrated passive devices (IPDs), to be directly mounted to base flange 181 for enhanced thermal conduction and/or electrical grounding purposes. Accordingly, in the illustrated example, PCB 183 is fabricated to include two outer wing sections 184, 186; and an intermediate section 188 located between or interposed with outer wing sections 184, 186, as taken along a longitudinal axis 190 of Doherty PA package 164. Further, a first input matching network 198 is at least partially formed on first outer wing section 184, a second input matching network 200 is at least partially formed on first outer wing section 186, and a transmission line 118-1 is at least partially formed on intermediate section 188 of PCB 183, as described below.

Amplifier dies 168, 170 are positioned in cutout or void regions 192 between sections 184, 186, 188, thus allowing direct thermal and electrical connections between dies 168, 170 and base flange 181. Stated differently, sections 184, 186, 188 of PCB 183 are interposed with dies 168, 170 along axis 190. Further, in the illustrated example, carrier and peaking pre-MNs are provided and realized utilizing IPDs, such as devices 194, 196, respectively. Alternatively, and as indicated above, devices 194, 196 could be discrete passive devices coupled to the base flange 181. Devices 194, 196 may be disposed in void regions 192 between sections 184, 186, 188, as shown; however, in further implementations, the carrier and peaking pre-MNs may have other constructions or dispositions within Doherty PA package 164, or Doherty PA package 164 may not contain such pre-MNs. Further, electrically-conductive patterned regions 198, 200 are provided on fingers 184, 186; e.g., regions 198, 200 may be microstrip transmission lines or patterned metal (e.g. copper) layers having generally triangular planform shapes. Regions 198, 200 are configured (by shaping and resistance tailoring) to accept bonding of bond wires 148, 214 along first edges proximate to and parallel with input leads 180, 182, and bond wires 204, 216 proximate to and parallel with input terminals of devices 194, 196, and also are configured to provide impedance matching on the input side of the Doherty PA package 164.

As previously indicated, central Doherty amplifier-combiner structure 106-1 shown in FIG. 4 is similar to central Doherty amplifier-combiner structure 106 shown in FIGS. 2 and 3. Thus, and referring also to FIGS. 2-3, central Doherty amplifier-combiner structure 106-1 likewise includes a transmission line 118-1 (corresponding to transmission line 118), die-to-die bond wires 134-1 (corresponding to bond wires 134), and die-to-substrate bond wires 130-1 (corresponding to bond wires 130). Further, as transmission line 118-1 is formed on intermediate wing section of PCB 183, intermediate wing section 188 generally corresponds to substrate 112 shown in FIGS. 2 and 3. Various bond wires interconnect the electrical components of Doherty PA package 164. In addition to the above-mentioned bond wires, these bond wires include: (i) a first group or array of bond wires 148 electrically coupling carrier input lead 180 to an input side of conductive region 198, (ii) a second group or array of bond wires 204 electrically coupling conductive region 198 to an input side of pre-MN device 194 (iii) a third or array of bond wires 206 electrically coupling an output side of pre-MN device 194 to a control terminal of carrier amplifier die 168 (e.g., the gate terminal or manifold of a FET), (iv) a fourth group or array of bond wires 208 coupling an output terminal of carrier amplifier die 168 (e.g., the drain manifold of a FET integrated within carrier amplifier die 168) to harmonic termination capacitor 210, (v) a fifth group or array of bond wires 212 electrically coupling an output end portion of transmission line 118-1 to RF output lead 178, (vi) a sixth group or array of bond wires 214 electrically coupling peaking input lead 182 to an input side of conductive layer or region 200, (vii) a seventh group or array of bond wires 216 electrically coupling conductive region 200 to an input side of pre-MN device 196, and (viii) an eighth group or array of bond wires 218 electrically coupling an output side of pre-MN device 196 to a control terminal of peaking amplifier die 170 (e.g., the gate manifold of a FET integrated within peaking amplifier die 170).

During operation of Doherty PA package 164, incoming RF signals applied to leads 180, 182 are directed through patterned regions 198, 200, bond wires 148, 204, 206, 214, 216, 218, and pre-MN devices 194, 196 to provide the desired impedance matching prior to application of the input RF signals to the carrier and peaking amplifiers on dies 168, 170. The amplified carrier signal output by carrier amplifier die 168 is transmitted via die-to-die bond wires 134-1 to a combining node on peaking amplifier die 170 (e.g., co-located with the peaking amplifier die drain manifold), where the amplified carrier signal is consolidated with an amplified peaking output signal generated by peaking amplifier die 170. Again, by imparting the bond wires of die-to-die bond wires 134-1 with an appropriate electrical length (e.g., resulting in 90 degrees of phase shift between the carrier amplifier die drain manifold and the combining node), the requisite phase delay is applied bringing the carrier output signal into phase coherence with the peaking output signal. Bond wires 130-1 then direct the consolidated RF signal into transmission line 118-1, which is imparted with physical characteristics (e.g., a resistance) raising the impedance to the impedance of the RF output lead 178 prior to transmission of the amplified signal to RF output lead 178. In embodiments, transmission line 118-1 may raise the impedance of the RF output signal to the reference plane of the electrical load coupled to RF output lead 178 thereby greatly reducing or eliminating the need for additional impedance transformation downstream of Doherty PA package 164.

Figure 5:
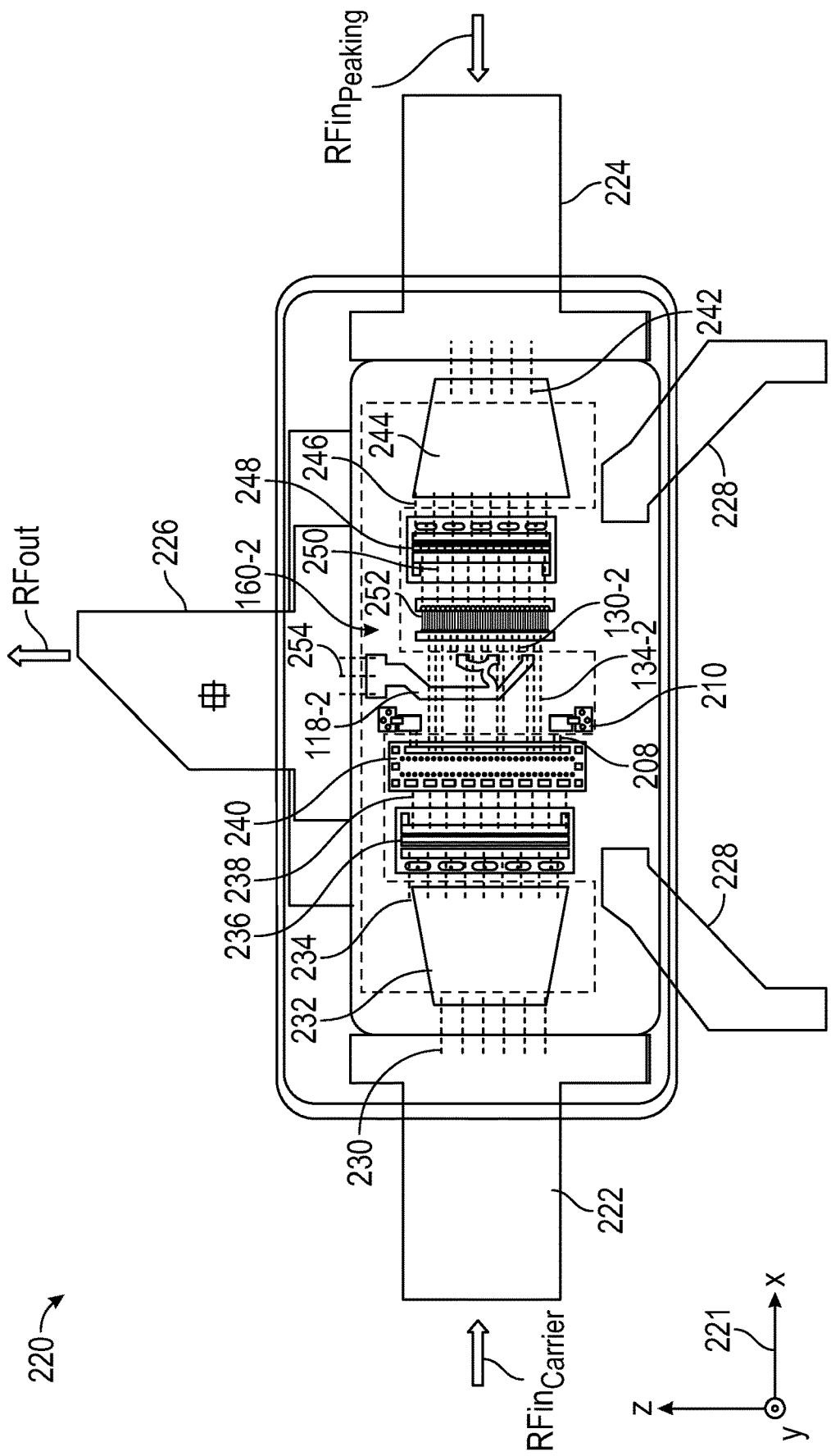
FIG. 5 is a generalized planform view of a second example Doherty PA device, which incorporates the example integrated combining output network shown in FIGS. 2-3 and which assumes the form of a discrete microelectronic package having a non-standardized lead layout optimized for usage with the integrated combining output network.

Turning next to FIG. 5, there is shown a second example Doherty PA device in the form of a Doherty PA package 220. As was the case previously with Doherty PA package 164, Doherty PA package 220 incorporates an example integrated combining output network 160-2 similar or identical to integrated combining network 160 described above in connection with FIGS. 2-3. However, in contrast to Doherty PA package 164, Doherty PA package 220 has a non-standard lead layout better tailored for usage with unique topology of integrated combining output network 160-2. More specifically, as can be seen in FIG. 5, example Doherty PA package 220 includes a carrier input lead 222, a peaking input lead 224, a consolidated-signal RF output lead 226, and a pair of bias leads 228. Doherty PA package 220 thus lacks any unused dummy leads, such as lead 176 described above in connection with package 164. Package leads 222, 224 project from opposing end portions of Doherty PA package 220 and extend parallel to a longitudinal axis of the Doherty PA package 220 (parallel to the X-axis of coordinate legend 221). Stated differently, Doherty PA package 220 may be described as having a first edge (the left edge in the orientation shown in FIG. 5), a second edge opposite the first edge, a third edge (the upper edge in the illustrated orientation) extending between the first and second edges, and a fourth edge opposite the third edge and further extending between the first and second edge. Input leads 222, 224 project outwardly from the first and second package edges, while the RF output lead 226 projects from the third edge of the package body at a location between (and perhaps substantially equidistant from) input leads 222, 224, as taken along the longitudinal axis of the package 220. Finally, bias leads 228 extends from the fourth edge of the package substantially opposite RF output lead 226. Advantageously, such an optimized lead layout avoids 90 degree (or similar)

signal transmission junctures to increase the linearity of the carrier and peaking paths extending from leads 222, 224 to transmission line 118-2 included in central Doherty amplifier-combiner structure 106-2.

By imparting Doherty PA package 220 with the depicted non-standardized lead layout, a highly linear, efficient signal transmission path is achieved as the carrier input signal is conducted from carrier input lead 222, through bond wires 230, through an impedance matching patterned layer 232, through bond wire 234, through input-side pre-MN device 236, through bond wires 238, and ultimately to the control terminal of a carrier amplifier die 240. Similarly, improved linearity of the peaking signal transmission path is achieved as the peaking input signal is conducted from peaking input lead 224, through bond wires 242, through an impedance matching patterned layer 244, through bond wires 246, through input-side pre-MN device 236, through bond wires 238, and ultimately to the input terminal (e.g., gate control terminal) of a peaking amplifier die 252. In another embodiment, patterned layers 232, 244 may be excluded, and bond wires may be directly coupled between the input leads 222, 224 and the input-side pre-MN devices 236, 248. Such a highly linear design improves the overall efficiency and reduced the complexity of Doherty PA package 220. Central Doherty amplifier-combiner structure 106-2 then provides the desired combination and impedance matching functions, and ultimately transmits the consolidated RF output signal over bond wires 254 to RF output lead 226 for application to the electrical load (e.g., an antenna) driven by the Doherty PA circuit.

Examples of a Doherty PA Module Having an Integrated Combining Output Network

Figure 6:
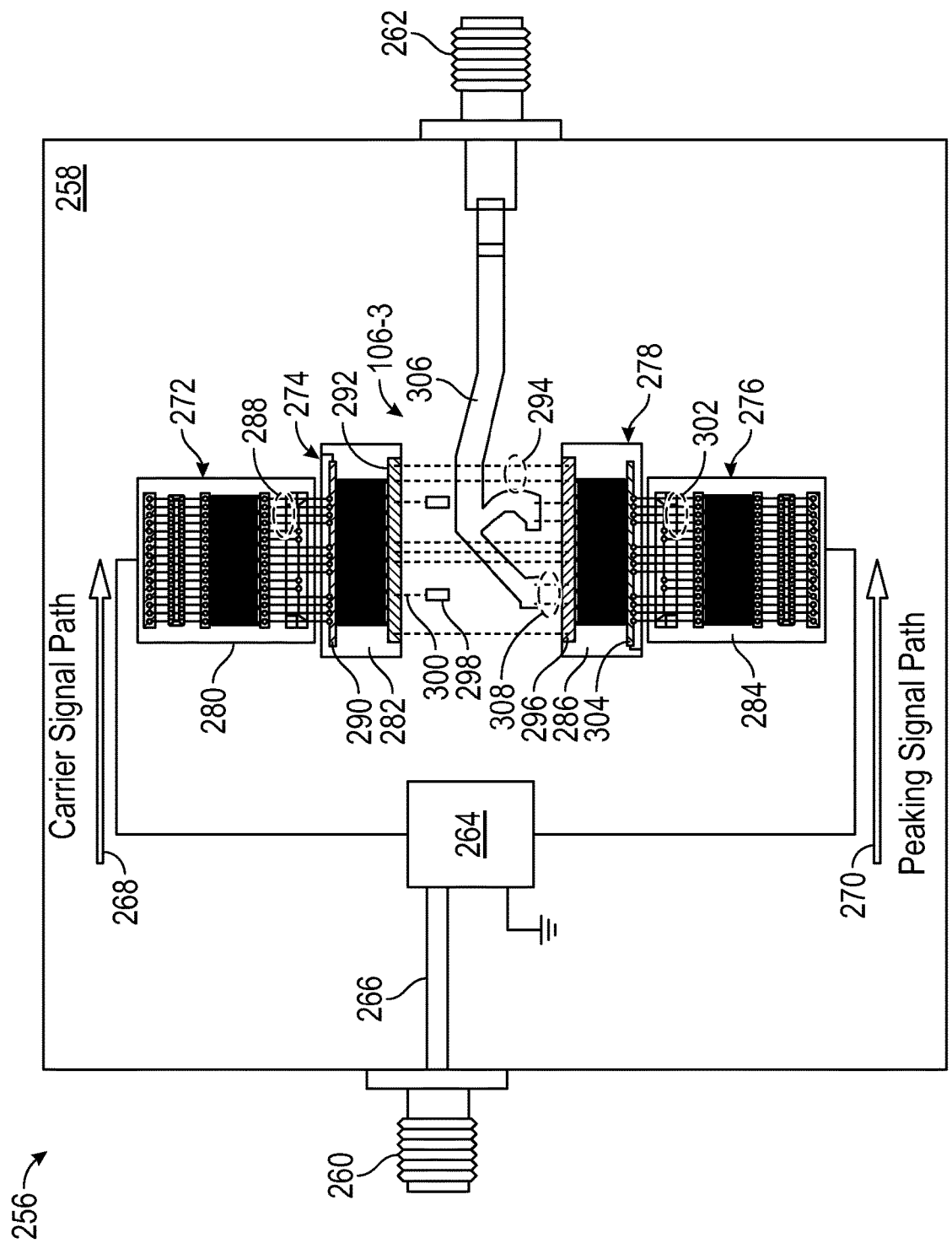
FIG. 6 is a generalized planform view of a third example Doherty PA device, which incorporates the example integrated combining output network shown in FIGS. 2-3 and which assumes the form of a Doherty PA module.

There has thus been described multiple examples of Doherty PA assemblies in the form of discrete microelectronic packages containing central Doherty amplifier-combiner structures similar or identical to that shown in FIGS. 2-3. In alternative embodiments, the Doherty PA device can be implemented in other forms beyond discrete microelectronic packages including, for example, a Doherty PA module including a splitter and phase adjustment circuitry. An example of such a Doherty PA module 256 is shown in FIG. 6, with module 256 including a further example implementation of central Doherty amplifier-combiner structure 106-3. Doherty PA module 256 is fabricated on a module substrate, such as a PCB 258, including an RF input terminal 260 and an RF output terminal 262. In the illustrated example, terminals 260, 262 are depicted as RF connectors; however, terminals 260, 262 can assume various other forms in other embodiments, such as lands on the bottom surface of PCB 258. A grounded splitter 264 is electrically coupled to the RF input terminal 260 by a transmission line 266. Grounded splitter 264 divides incoming RF signals along a carrier signal amplification path 268 and a peaking signal amplification path 270. A carrier driver stage 272 and a final carrier amplification stage 274 are positioned in carrier signal amplification path 268, while a peaking driver stage 276 and a final peaking amplification stage 278 are positioned in carrier path 270. In embodiments, carrier driver stage 272 and final carrier amplification stage 274 may be implemented utilizing a first and second amplifier dies 280, 282, respectively. Similarly, peaking driver stage 276 and a final peaking amplification stage 278 may be implemented utilizing two different amplifier dies 284, 286.

In some embodiments, each of the carrier and peaking amplifiers may include a single-stage amplifier (i.e., including a single power transistor), or a multiple-stage amplifier (e.g., including a driver transistor and a final-stage transistor, as shown). In the latter case, the multiple stages may be included on a single semiconductor die (e.g., a silicon-based or GaN-based die), or each of the stages may be included on separate die, as is illustrated in FIG. 6. Further, when the driver and final-stage transistors are implemented on separate die, the drain of the driver transistor may be electrically coupled to the gate of the final-stage transistor using a bond wire array, for example, or using another type of connection. Further, in such embodiments, the semiconductor technology for the driver transistor and the final-stage transistor may be the same (e.g., silicon-based or GaN-based), or the semiconductor technologies may be different. For example, in one embodiment and with continued reference to FIG. 6, the driver transistors included in driver stages 272, 276 may be silicon-based transistors (e.g., LDMOS transistors), while the final-stage transistors included in final amplification stages 274, 278 may be GaN-based transistors (e.g., GaN high electronic mobility transistor (HEMT)). Alternatively, the driver transistors included in driver stages 272, 276 may be GaN-based transistors and the transistors included in final amplification stages 274, 278 may be silicon-based transistors. Other types of semiconductor technologies may be used for the driver and final-stage transistors, as well.

After transmission through carrier driver stage 272, the carrier signal is transmitted through bond wires 288 and to an input terminal 290 of carrier amplifier die 282, such as the gate or control terminate of a FET formed on die 282. The FET of carrier amplifier die 282 amplifies this signal and outputs the amplified carrier signal via output terminal 292; e.g., an elongated pad and drain manifold. The amplified carrier signal is then transmitted over bond wires 294 to an output terminal/combining node 296 provided on peaking amplifier die 286. As previously indicated, bond wires 294 may be dimensioned such that the total electrical length between output terminal 292 of carrier amplifier die 282 and output terminal/combining node 296 provided on peaking amplifier die 286 is approximately 90 degrees to compensate for the phase shift in the amplified carrier and peaking signals. Additionally, shunt capacitances 298 may be formed in PCB 258 and electrically coupled to output terminal 292 of carrier amplifier die 282 via bond wires 300, with capacitances 298 and bond wires 300 forming an LC harmonic termination circuit tuned to, for example, terminate the second harmonic frequency. Although not shown in FIG. 6, like harmonic termination circuits may also be electrically coupled to output terminal/combining node 296 of peaking amplifier die 286. Similarly, the peaking signal outputted from peaking driver stage 276 is transmitted over bond wires 302 to input terminal 304 of the FET formed on peaking amplifier die 286. The amplified peaking signal is then combined with the amplified carrier signal at output terminal/combining node 296 of peaking amplifier die 286 and further transmitted to the input end of a transmission line 306 via bond wires 308. Transmission line 306 then carries the amplified, consolidated RF output signal to output terminal 262 for application to a non-illustrated electrical load coupled to Doherty PA module 256, with transmission line 306 raising the impedance of the RF output signal to, for example, a level matching the reference plane of the electrical load coupled to output terminal 292 of Doherty PA module 256. Finally, various additional components can also be incorporated into Doherty PA module 256, which are not shown in FIG. 6. Such components can include, for example, bias circuitry and bar vias or coin attach below carrier and peaking amplifier stages 274, 278 for improved thermal performance.

CONCLUSION

There has thus been provided Doherty PA assemblies (e.g., packages and modules) containing post-amplifier circuitry integrated into the Doherty PA device and enabling phase coherency, impedance transformation, and signal recombination of carrier and peaking signals to be achieved in a highly efficient, compact design. Embodiments of the Doherty PA device achieve such benefits, at least in part, through one or more die-to-die bond wires bonded between carrier and peaking amplifier dies within the Doherty PA device. A combining node is provided on one of the dies, with the bond wires then applying the desired phase delay to ensure phase coherency as the carrier and peaking signals are consolidated at the combining node. In embodiments, the output capacitance of the carrier amplifier may be absorbed into the (e.g., quarter wave) transformer network to provide a highly efficient design. Further, the dies may be oriented such to minimize the distance between the combining node and the output terminal (e.g., drain manifold) of the carrier amplifier die. A transmission line provides a desired impedance transformation of the consolidated RF output signal, while conducting the signal to and output terminal of the Doherty PA circuit. The transmission line may raise the impedance of the RF output signal to a level matching the reference plane of the electrical load (e.g., ranging from 40 to 60Ω and, perhaps, substantially equal to 50Ω in the case of certain antennae) to minimize, if not eliminate. the need for additional impedance matching outside of the Doherty PA device. This, in turn, may enable a large reduction in the overall size of the Doherty PA circuit. The above-described designs also enable the flexibility of providing harmonic terminations at the output terminal (e.g., the drain terminal) of the peaking and/or carrier transistors, such as through the provision of a shunt inductance-capacitance arrangement electrically coupled between the drain of the carrier and/or peaking amplifier die and the above-described die-interposed substrate. Combiner losses are consequently minimized, while bandwidth is increased, particularly at higher frequency (e.g., >1.8 GHz) operation.

In various embodiments, the Doherty PA device includes a first amplifier die having a first transistor with a first output terminal at which a first amplified signal is generated, a second amplifier die having a second transistor with a second output terminal at which a second amplified signal is generated, and an output combining network. The output combining network includes, in turn, a combining node integrally formed with the second amplifier die and electrically coupled to the second output terminal. At least one die-to-die bond wire is connected between the first amplifier die and the second amplifier die to electrically couple the first output terminal to the combining node. The at least one die-to-die bond wire has an electrical length resulting in a 90 degree phase shift imparted to the first amplified signal between the first output terminal and the combining node. In at least some implementations, the first amplifier die and the second amplifier die assume the form a carrier amplifier die and a peaking amplifier die, respectively.

In still further embodiments, the Doherty PA device includes an RF output terminal, a peaking amplifier die having a peaking output terminal at which an amplified peaking signal is generated, a carrier amplifier die having a carrier output terminal at which an amplified carrier signal is generated, and a substrate adjacent the peaking amplifier die and the carrier amplifier die. A transmission line is formed on the substrate and includes an input end portion and an output end portion, which is electrically coupled to the RF output terminal. The in input end portion of the transmission line is located between the peaking die amplifier die and the carrier amplifier die, as seen looking downward on the substrate along an axis orthogonal to a frontside of the substrate. A first bond wire or bond wire array electrically connects the carrier output terminal to the peaking output terminal such that amplified peaking signal and the amplified carrier signal combine to yield a combined RF output signal at the peaking output terminal. Finally, a second bond wire or bond wire array electrically connects the peaking output terminal to the input end portion of the transmission line such that the combined RF output signal is transmitted from peaking output terminal, through the second bond wire or bond wire array, through the transmission line, and to the RF output terminal during operation of the Doherty PA device.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like have been used above in accordance with the order in which certain elements (e.g., package leads, transistors, and transistor-carrying die) were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. A Doherty power amplifier (PA) device, comprising:
   a first amplifier die having a first transistor with a first output terminal at which a first amplified signal is generated;
   a second amplifier die having a second transistor with a second output terminal at which a second amplified signal is generated; and
   an output combining network, comprising:
      a combining node integrally formed with the second amplifier die and electrically coupled to the second output terminal;
      at least one die-to-die bond wire connected between the first amplifier die and the second amplifier die to electrically couple the first output terminal to the combining node, the at least one die-to-die bond wire having an electrical length resulting in a 90 degree phase shift imparted to the first amplified signal between the first output terminal and the combining node;
      a transmission line disposed between the first and second amplifier dies, wherein the transmission line includes an intermediate portion coupled to an input end portion that includes multiple prongs extending from the intermediate portion toward the second amplifier die;
multiple bond pads at ends of the multiple prongs; and
a plurality of die-to substrate bond wires coupled between the second output terminal and the multiple bond pads.

2. The Doherty PA device of claim 1, wherein the first amplifier die and the second amplifier die comprise a carrier amplifier die and a peaking amplifier die, respectively.

3. The Doherty PA device of claim 1, wherein the first amplifier die comprises a first drain manifold; and
wherein the second amplifier die comprises a second drain manifold integrally formed with the combining node.

4. The Doherty PA device of claim 3, wherein the first drain manifold and the second drain manifold each extend substantially parallel with a first axis;
wherein the first transistor and second transistor further comprise a first gate manifold and a second gate manifold, respectively; and
wherein the first and second drain manifold are located between the first and second gate manifolds, as taken along a second axis perpendicular to the first axis.

5. The Doherty PA device of claim 1, further comprising:
a radio frequency (RF) output terminal.

6. The Doherty PA device of claim 5, wherein the output combining network further comprises:
a conductive base flange; and
a substrate mounted on the conductive base flange between the carrier amplifier die and the peaking amplifier die, and
wherein the first and second transistor dies are directly mounted on the conductive base flange, and the transmission line is formed on the substrate and electrically couples the die-to-substrate bond wires to the RF output terminal, the transmission line having an output end portion coupled to the intermediate portion and to the RF output terminal.

7. The Doherty PA device of claim 6, wherein the die-to-die bond wire extends over at least a portion of the input end portion of the transmission line, as viewed along an axis orthogonal to an upper surface of the substrate.

8. The Doherty PA device of claim 6, further comprising a package body in which the first amplifier die, the second amplifier die, and the output combining network are housed;
wherein the substrate comprises a printed circuit board embedded in the package body.

9. The Doherty PA device of claim 6, wherein the substrate comprises:
a first outer wing section on which a portion of a first input matching network is formed;
a second outer wing section on which a portion of a second input matching network is formed; and
an intermediate section between the first outer wing section and the second outer wing section, the transmission line at least partially formed on the intermediate section of the substrate.

10. The Doherty PA device of claim 6, wherein the transmission line is configured to raise an impedance of the combined RF output signal from a first value at the input end portion to a second value greater than the first value at the output end portion.

11. The Doherty PA device of claim 10, wherein the second value is between 40 and 60 ohms.

12. The Doherty PA device of claim 1, further comprising:
a substrate; and
a first harmonic termination circuit electrically coupled between: (i) the substrate and the first output terminal, or (ii) the substrate and the second output terminal.

13. The Doherty PA device of claim 12, wherein the first harmonic termination comprises:
a shunt capacitor coupled to the substrate; and
at least one die-to-substrate bond wire electrically coupling the first or second output terminal to the shunt capacitor.

14. A Doherty power amplifier (PA) device, comprising:
a radio frequency (RF) output terminal;
a peaking amplifier die having a peaking output terminal at which an amplified peaking signal is generated;
a carrier amplifier die having a carrier output terminal at which an amplified carrier signal is generated;
a substrate adjacent the peaking amplifier die and the carrier amplifier die;
a transmission line formed on the substrate, the transmission line comprising:
an intermediate portion,
an input end portion coupled to the intermediate portion and located between the peaking die amplifier die and the carrier amplifier die, as seen looking downwardly on the substrate along a first axis orthogonal to a frontside of the substrate, wherein the input end portion includes multiple prongs extending from the intermediate portion toward the peaking amplifier die and multiple bond pads at ends of the multiple prongs, and
an output end portion coupled to the intermediate portion and electrically coupled to the RF output terminal;
a first bond wire or bond wire array electrically connecting the carrier output terminal to the peaking output terminal such that amplified peaking signal and the amplified carrier signal combine to yield a combined RF output signal at the peaking output terminal; and
a second bond wire or bond wire array electrically connecting the peaking output terminal to the multiple bond pads of the input end portion of the transmission line such that the combined RF output signal is transmitted from the peaking output terminal, through the second bond wire or bond wire array, through the transmission line, and to the RF output terminal during operation of the Doherty PA device.

15. The Doherty PA device of claim 14, further comprising:
a shunt capacitance coupled to the substrate; and
a third bond wire or bond wire array electrically coupling the peaking output terminal or the carrier output terminal to the shunt capacitance and combining with the shunt capacitance to form a harmonic termination circuit.

16. The Doherty PA device of claim 14, wherein at least a portion of the first bond wire or bond wire array extends over the input end portion of the transmission line, as seen looking downward on the substrate along the first axis.

17. The Doherty PA device of claim 14, wherein the peaking amplifier die and carrier amplifier die further comprise a peaking input terminal and a carrier input terminal, respectively;
wherein the peaking output terminal and the carrier output terminal are located between the peaking input terminal and the carrier input terminal, as taken along a second axis perpendicular to the first axis.

18. The Doherty PA device of claim 14, wherein the Doherty PA device comprises a Doherty PA package having a package body;
- wherein the RF output terminal comprises an RF output lead extending from the package body; and
- wherein the substrate comprises a printed circuit board embedded in the package body.

19. The Doherty PA device of claim 18, further comprising a flange located beneath the printed circuit board, as taken along the first axis;
- wherein the printed circuit board comprises cutout sections through which the peaking die and the carrier die extend to attach to the flange.

20. The Doherty PA device of claim 14, wherein the Doherty PA device comprises a Doherty PA module; and
- wherein the substrate comprises a printed circuit board to which the peaking amplifier die and the carrier amplifier die are mounted.

* * * * *